US010023971B2

(12) United States Patent
Nesbitt et al.

(10) Patent No.: US 10,023,971 B2
(45) Date of Patent: Jul. 17, 2018

(54) ALUMINUM NANOWIRE ARRAYS AND METHODS OF PREPARATION AND USE THEREOF

(71) Applicant: The Trustees of Boston College, Chestnut Hill, MA (US)

(72) Inventors: Nathan T. Nesbitt, Brighton, MA (US); Michael J. Naughton, Chestnut Hill, MA (US)

(73) Assignee: The Trustees of Boston College, Chestnut Hill, MA (US)

( * ) Notice: Subject to any disclaimer, the term of this patent is extended or adjusted under 35 U.S.C. 154(b) by 55 days.

(21) Appl. No.: 15/059,200

(22) Filed: Mar. 2, 2016

(65) Prior Publication Data
US 2016/0258069 A1    Sep. 8, 2016

Related U.S. Application Data

(60) Provisional application No. 62/127,533, filed on Mar. 3, 2015.

(51) Int. Cl.
| | |
|---|---|
| *H01L 21/311* | (2006.01) |
| *H01L 21/302* | (2006.01) |
| *H01L 21/461* | (2006.01) |
| *H01B 13/00* | (2006.01) |
| *B44C 1/22* | (2006.01) |
| *C23F 1/00* | (2006.01) |
| *C25F 3/20* | (2006.01) |
| *H01L 31/0352* | (2006.01) |
| *H01L 21/02* | (2006.01) |
| *H01L 29/66* | (2006.01) |
| *C25D 11/04* | (2006.01) |
| *C25D 11/16* | (2006.01) |
| *C25D 11/24* | (2006.01) |
| *C25D 11/02* | (2006.01) |
| *C25B 1/00* | (2006.01) |

(52) U.S. Cl.
CPC ............... *C25F 3/20* (2013.01); *C25B 1/003* (2013.01); *C25D 11/022* (2013.01); *C25D 11/045* (2013.01); *C25D 11/16* (2013.01); *C25D 11/24* (2013.01); *H01L 21/0223* (2013.01); *H01L 29/66818* (2013.01); *H01L 31/0352* (2013.01)

(58) Field of Classification Search
None
See application file for complete search history.

(56) References Cited

U.S. PATENT DOCUMENTS

| | | | | |
|---|---|---|---|---|
| 2009/0038683 | A1* | 2/2009 | Walter | H01L 51/0015 136/263 |
| 2011/0248315 | A1* | 10/2011 | Nam | B82Y 10/00 257/184 |
| 2013/0022995 | A1* | 1/2013 | Park | C23C 16/0281 435/7.23 |

FOREIGN PATENT DOCUMENTS

WO     2014/031172     *   2/2014

* cited by examiner

*Primary Examiner* — Stephanie P. Duclair
(74) *Attorney, Agent, or Firm* — Milstein Zhang & Wu LLC

(57) ABSTRACT

The invention provides a novel, template-free process for the fabrication of metal nanowires of novel dimensions. The unconventional method produces highly ordered and free-standing aluminum nanowire arrays.

11 Claims, 17 Drawing Sheets

ALUMINUM NANOWIRE ARRAYS AND METHODS OF PREPARATION AND USE THEREOF

PRIORITY CLAIMS AND RELATED APPLICATIONS

This application claims the benefit of U.S. Provisional Application No. 62/127,533, filed Mar. 3, 2015, the entire content of which is incorporated herein by reference in its entirety.

TECHNICAL FIELDS OF THE INVENTION

The present invention generally relates to metal nanowire arrays and their fabrication. More particularly, the invention relates to a novel fabrication process for metal nanowires of novel dimensions that are particularly desired in applications such as nanoscale photonic and plasmonic transmission, nanocoax solar cells, and non-diffraction-limited optical microscopy.

BACKGROUND OF THE INVENTION

Vertically-oriented, lithographically-ordered, metal nanowire arrays (MNAs) have potential utility as capacitors, high surface area electrodes, electrochemical biosensors, optical nanoscopes, rectennas, and solar cells. MNAs are desired for their high specific surface area, high aspect ratio, unity dimensionality, high conductivity, orthogonality to an underlying substrate, and feature sizes on the order of a wavelength of light. MNAs are often coated with materials to produce core-shell or nanocoax structures, which, for many deposition processes, requires the nanowires to be freestanding to accomplish a homogeneous coating.

Currently, only a limited range of nanowire heights and array pitches can be produced in ordered arrays using metallic materials. Chemical vapor deposition, a method of nanowire fabrication with tunable height and pitch, produces metal nanowires in only disordered arrays (FIG. 1a) or carbon nanofibers having low electrical conductivity (FIG. 1b).

Electroplating metals in anodized aluminum oxide (AAO) template nanopores produces highly conductive and ordered arrays (FIG. 1c), but a maximum pitch of 2 µm typically causes the nanowires to cluster together due to local attractive forces.

These methods all utilize templates composed of dielectrics with vertical pores. Typically these templates are grown or deposited onto substrates, their pores are filled with metal, and they are dissolved away to produce freestanding wires on the substrate. A notable drawback of the present fabrication processes is that only certain dimensions can be accessed. If the aspect ratio of the wires becomes too large they are likely to cluster due to van der Waals' interactions, losing their freestanding nature. This clustering inhibits many material deposition processes from conformally coating the wires, limiting application of the nanowire array to core-shell and nanocoax architectures. Clustering also changes the geometry of the nanowire array, impacting applications such as plasmonic devices that would utilize the interaction of incident radiation with freestanding wires.

There remains unmet need for novel fabrication processes of greater tunability of nanowire height and pitch and for MNAs with enhanced optical and electronic properties for applications in energy conversion and storage, material deposition, sensing, communication, and computation.

SUMMARY OF THE INVENTION

The invention provides a novel, template-free process for the fabrication of metal nanowires of novel dimensions. The unconventional method produces highly ordered and freestanding aluminum nanowire arrays.

The metal (e.g., Aluminum) nanowires are fabricated in ordered vertical arrays on bulk metal foil with controlled wire dimensions and spacing. Large aspect ratio wires were obtained, including sub-micron wire diameters and supra-10 µm height. The novel method of fabrication utilizes nanoimprint lithography and the economical electrochemical anodization process used to make AAO templates, allowing facile production and scalability. Arrays of vertical metallic nanowires (i.e. differing from semiconductor nanowire or carbon nanofiber arrays) of the obtained dimensions are novel here. These dimensions are favorable for nanoscale photonic and plasmonic transmission, nanocoax solar cells, and non-diffraction-limited optical microscopy.

This process etches the nanowires from the underlying substrate at lithographically-defined locations, providing high tunability of the array geometry. Additionally, the method of the invention is amenable to low-cost, large-scale production because it is solution based, roll-to-roll compatible, operates at atmospheric pressure with temperatures between 0° C. and 60° C., and uses Al, an earth abundant and inexpensive metal.

In one aspect, the invention generally relates to a metal nanowire array comprising a plurality of vertically-oriented and laterally-ordered metal nanowires at discrete positions having substantially the same height with pitches between the nanowires being greater than about 1 µm. In preferred embodiments, the metal is aluminum (Al).

In another aspect, the invention generally relates to a product of manufacture comprising a metal nanowire array disclosed herein. The product may be any component, device or instrument, for example, suitable for or used as energy conversion and storage (solar cell, electrolyzer, dielectric capacitor, heat tube), material deposition (electrostatic vapor deposition), sensing (including plasmonic), communication (plasmonic waveguide, photonic crystal), and computation (plasmonic waveguide).

In yet another aspect, the invention generally relates to a method for producing ordered metal nanowire arrays. The method includes: providing a metal substrate; imprinting the surface of the metal substrate to form a plurality of indents and missing indents at lithographically-defined locations according to a pre-selected pattern; and anodizing the metal substrate to form a metal oxide template corresponding to the indents and missing indents according to the pre-selected pattern.

In yet another aspect, the invention generally relates to a method for producing ordered metal nanowire arrays. The method includes: providing a metal substrate; masking the surface of the metal substrate to form a plurality of openings and missing openings in a dielectric coating at lithographically-defined locations according to a pre-selected pattern; and anodizing the metal substrate to form a metal oxide template corresponding to the openings and missing openings according to the pre-selected pattern.

In certain embodiments, the method further includes etching the anodized metal oxide to form a plurality of vertically-oriented and laterally-ordered metal nanowires according to the pre-selected pattern. In certain other embodiments, it may be advantageous to utilize the metal nanowires embedded in their metal oxide. In certain embodiments, the method further includes rinsing the metal substrate.

In yet another aspect, the invention generally relates to metal nanowire arrays produced by a method disclosed herein.

In yet another aspect, the invention generally relates to a product of manufacture comprising a metal nanowire array produced by a method disclosed herein.

Thus, for an indent array pitch of 1.2 pm, this sample suggests imprint post diameter must be ≤400 nm for an AAO template and embedded Al nanowires to form. SEMs (a.i) and (a.ii) are representative images from areas of the sample neighboring (b.i), (c.i) and (b.ii), (c.ii), respectively. Scale bars 2 µm.

Figure 16:
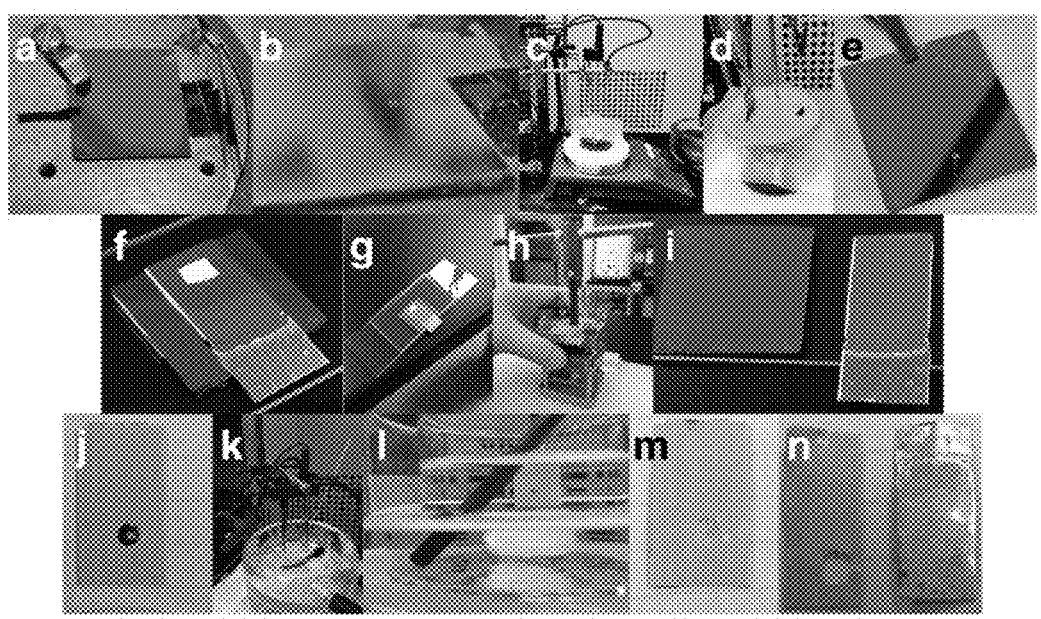

FIG. 16 shows photos of fabrication process and setup: (a) Ni-coated glass with PMMA film for EBL, (b) after development of the nanopores in the PMMA film, (c-e) electrodeposition of Ni into the PMMA pores, (f) stack of electropolished Al lying polished side-down on Ni posts, with PTFE tape over region to be stamped, (g) stack sandwiched between two glass slides, (h) custom-made vice for indenting the Al, (i) Ni stamp and the indented Al, (j) Al masked with adhesive PTFE tape, with a window exposing the indented region of the Al, (k) anodization setup including the jacketed beaker for temperature control, (l) carbon rod counter electrode, PTFE coated magnetic stirring rode, and masked Al during anodization, (m) Al after anodization, (n) Al and PTFE tape after removal of the tape.

Figure 17:
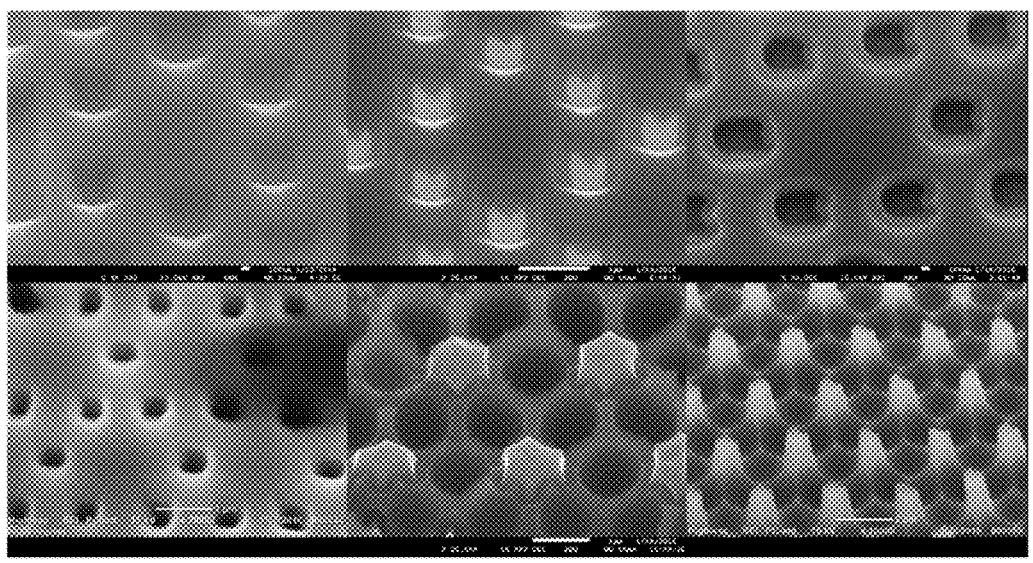

FIG. 17 shows scanning electron micrographs after several fabrication steps using method 3 to produce Al nanowires. Top-left: SU8 film after imprint procedure and curing; top-center: SU8 film and exposed $Al_2O_3$ film after dry-etch in plasma; top-right: SU8 film and $Al_2O_3$ film after wet-etch of $Al_2O_3$ film; bottom-left: SU8 film and $Al_2O_3$ film on AAT produce by anodization; bottom-center: AAT and embedded Al nanowires after partial etch of AAT; bottom-right: exposed Al nanowires after full etch of AAT. Tilt 30 degrees for all images.

DETAILED DESCRIPTION OF THE INVENTION

The invention provides a novel, template-free process for the fabrication of metal nanowires of novel dimensions. This novel approach offers greater tunability of nanowire height and pitch and MNAs with enhanced optical and electronic properties for applications in energy conversion and storage (solar cell, electrolyzer, dielectric capacitor, heat tube), material deposition (electrostatic vapor deposition), sensing (plasmonic), communication (plasmonic waveguide, photonic crystal), and computation (plasmonic waveguide).

Figure 1:
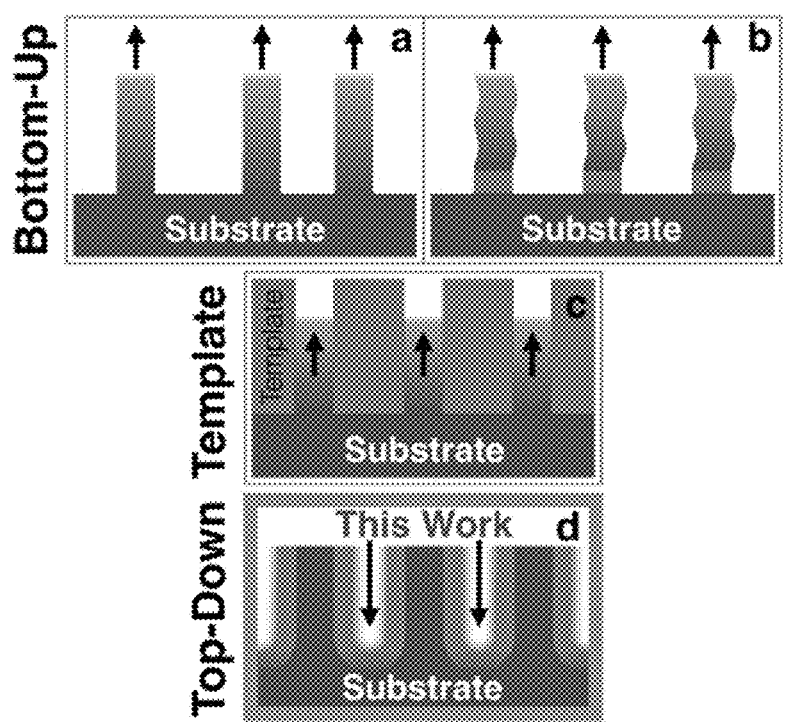
FIG. 1 shows methods of fabricating nanopillar arrays for dielectrics and for metals. (a) Chemical vapor deposition (CVD) of Ni or Co: a bottom-up process that produces vertically oriented nanowires with irregular spacing between them. (b) CVD of carbon nanofibers: a bottom-up process that produces disordered nanowires with poor conductivity relative to good metals; orange rectangles represent particles the nanofibers nucleate on. (c) Electrodeposition of metal nanowires in templates: a template-based method that produces metal nanowires in an ordered array. Existing templates, such as porous AAO, have limited pitch, which causes these wires to bundle; orange rectangles represent a porous template. (d) Al nanowire arrays via directed assembly: a top-down process that produces lithographically ordered, vertically oriented, freestanding metal nanowire arrays—possibly the first top-down method of metal nanowire fabrication; orange layer represents AAO.
Figure 2:
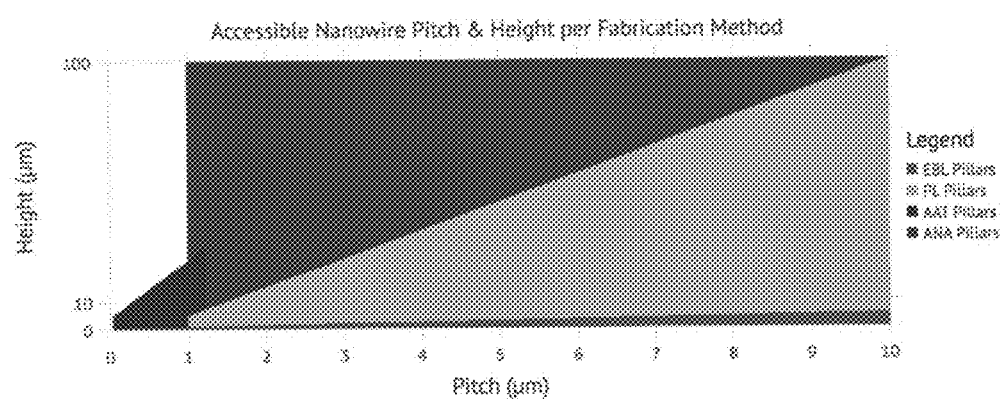
FIG. 2 shows height and pitch dimensions accessible by various fabrication processes for solid-core MNAs.

The unconventional method produces highly ordered and freestanding aluminum nanowire arrays with controlled height, pitch, and diameter (FIG. 1d). The disclosed method enables fabrication of: (i) vertically-oriented aluminum nanowires with pitch greater than one or two micrometers, (ii) a laterally-ordered array of vertically-oriented metal nanowires with pitch greater than a few micrometers, (iii) an array of vertically-oriented metal nanowires with pitch greater than one or two micrometers and with height greater than about ten micrometers, (iv) vertically-oriented metal nanowires in discrete, controlled positions with the attributes discussed above, and (v) aluminum nanowires with hexagonal cross-section and with cross-section containing "sharp edges". (See, Nesbitt, et al. 2015 Nano Lett. 15, 7294-7299, including Supporting Information, incorporated herein by reference in its entirety for all purposes).

The term "nanowire" refers to an elongated structure having an arbitrary cross section of dimension less than about one micrometer (µm) and length between one and one hundred micrometers (µm) with length-to-diameter aspect ratio between about two and one hundred. The term "array" is meant as one or more nanowires configured in a 2 dimensional plane perpendicular to their length. The term "vertical" is meant to indicate that nanowire orientation is nominally perpendicular to the substrate or to the plane of the array. When in a vertically-oriented array, the length of the nanowires may be referred to as their "height".

A key feature of the disclosed method is that it is a template-free process, which selectively etches away aluminum from a bulk aluminum substrate without the use of a template. This avoids a possible boundary between the wires and substrate. Additionally, the wires can be made from highly pure (99.99%) aluminum, which would likely be difficult to obtain via deposition processes (e.g., electrodeposition or electroless deposition) compatible with filling templates, and may have advantages in certain applications such as plasmonics. Processes currently exist to fabricate dense arrays of approximately vertical metal nanowires, but these nanowires almost always bunch together due to their high packing density, limiting or preventing their use in many applications.

In one aspect, the invention generally relates to a metal nanowire array comprising a plurality of vertically-oriented and laterally-ordered metal nanowires at discrete positions having substantially the same height with pitches between the nanowires being greater than about 1 µm. In preferred embodiments, the metal is Al.

In certain embodiments, the plurality of vertically-oriented metal nanowires are characterized with height being greater than about 10 µm (e.g., greater than about 12 µm, about 15 µm, about 17 µm, about 20 µm) and are positioned with pitches greater than about 2 µm (e.g., greater than about 2.5 µm, about 3 µm, about 3.5 µm, about 4 µm, about 4.5 µm, about 5 µm).

In certain embodiments, the plurality of vertically-oriented metal nanowires are characterized by a hexagonal cross-section. In certain embodiments, the hexagonal cross-section comprises sharp edges.

In another aspect, the invention generally relates to a product of manufacture comprising a metal nanowire array disclosed herein. The product may be any component, device or instrument, for example, suitable for or used as energy conversion and storage (solar cell, electrolyzer, dielectric capacitor, heat tube), material deposition (electrostatic vapor deposition), sensing (plasmonic), communication (plasmonic waveguide, photonic crystal), and computation (plasmonic waveguide).

In yet another aspect, the invention generally relates to a method for producing ordered metal nanowire arrays. The method includes: providing a metal substrate; imprinting the surface of the metal substrate to form a plurality of indents and missing indents at lithographically-defined locations according to a pre-selected pattern; and anodizing the metal substrate to form a metal oxide template corresponding to the indents and missing indents according to the pre-selected pattern.

In yet another aspect, the invention generally relates to a method for producing ordered metal nanowire arrays. The method includes: providing a metal substrate; masking the surface of the metal substrate to form a plurality of openings and missing openings in a dielectric coating at lithographically-defined locations according to a pre-selected pattern; and anodizing the metal substrate to form a metal oxide template corresponding to the openings and missing openings according to the pre-selected pattern.

In certain embodiments, the method further includes etching the anodized metal oxide to form a plurality of vertically-oriented and laterally-ordered metal nanowires according to the pre-selected pattern. In certain other embodiments, it may be advantageous to utilize the metal nanowires embedded in their metal oxide. In certain embodiments, the method further includes rinsing the metal substrate.

In certain preferred embodiments of the method, the metal is Al.

In certain preferred embodiments of the method, the metal substrate is a metal foil.

In certain preferred embodiments of the method, imprinting the surface of the metal substrate is performed with a Ni stamp.

In certain preferred embodiments of the method, anodizing the metal substrate forms an aluminum oxide ($Al_2O_3$) template.

In certain preferred embodiments of the method, etching the anodized metal oxide results in a plurality of vertically-oriented, freestanding metal nanowires.

In certain preferred embodiments of the method, the plurality of vertically-oriented metal nanowires are laterally-ordered with discrete and controlled positions.

In certain preferred embodiments of the method, wherein the plurality of vertically-oriented metal nanowires are characterized by a height being greater than about 10 μm and are positioned with pitches greater than about 2 μm.

In certain preferred embodiments of the method, wherein the metal nanowires are characterized by a hexagonal cross-section.

In certain preferred embodiments of the method, wherein the hexagonal cross-section comprises sharp edges.

In yet another aspect, the invention generally relates to metal nanowire arrays produced by a method disclosed herein.

In yet another aspect, the invention generally relates to a product of manufacture comprising a metal nanowire array produced by a method disclosed herein.

The substrate and wires are made of Al, which makes an ohmic contact with Si, and may exhibit desirable plasmonic properties. High purity (e.g., 99.99%) Al foils can be used to have lower losses in plasmonic devices than Al structures made with thin-film deposition systems, which typically have a non-negligible oxide content within their bulk. The wires have a hexagonal cross-section with a radius of curvature of 10 nm at the edges of 700 nm diameter 10 μm tall wires, demonstrating the ability to produce nanometer-scale feature sizes on micron-scale wires. These qualities indicate that this process may be very promising for a wide range of photonic, electronic, and electrochemical applications.

The present invention demonstrates features and advantages that will become apparent to one of ordinary skill in the art upon reading the attached Detailed Description. The present invention can be used as a dimension-tunable scaffold for thin film solar cells. This architecture can provide (1) spatial regions of enhanced electric field which enhances light absorption and (2) high surface area for enhanced volume of thin film material per unit projected surface area for enhanced light absorption. This allows for thinner films, which is advantageous for electronic properties of thin-film solar cells. This scaffold can be an electrode in a photoelectrochemical solar cell (e.g. for water splitting), or can provide the core conductor in a nanocoax solar cell. Currently, to satisfy this need, non-conducting pillars are coated with metal, causing "dead space" that limits how narrow the core pillar plus metal can be for a given conductivity of the metal layer.

The present invention can be used as a dimension-tunable scaffold for high surface area electrodes for electrochemical applications, such as water splitting in an electrolyzer with earth abundant hydrogen evolution and oxygen evolution catalysts. The present invention can also be used as a converging array of high aspect-ratio metallic nanowires for a non-diffraction-limited optical microscope, using photons or plasmon polaritons to conduct light from the evanescent field at a material surface along wires with sub-diffraction limited spacing.

The present invention can be used as an electrode with periodic sharp points for using strong electric fields to atomize a liquid film wetting the Al nanowire surface in an electrostatic vapor deposition system.

The present invention can be used as a two-dimensional photonic crystal. The controlled lattice configuration, high spatial order (regularity or periodicity), and pitch of the nanowires make aluminum nanowire arrays candidates for two-dimensional photonic crystal applications. For example, an array of aluminum nanowires can be made with a channel passing through the array devoid of any nanowires, creating a waveguide for light in the forbidden gap of the photonic crystal comprised of the nanowires. As the periodicity of photonic crystals must be approximately half the wavelength of the incident radiation to be diffracted, currently realized aluminum nanowire arrays with pitch 2.4 micrometers would be applicable to deep infrared. It is conceivable that aluminum nanowire arrays can be made with pitch 800 nanometers (nm), which would provide a photonic crystal for the most common telecommunications wavelength, 1550 nm.

The present invention can be used for electric field enhancement either: 1) via sharp-edge-induced field concentration for improved sensitivity of chemical/biological sensor relying on shift in plasmonic resonance intensity or frequency or 2) via plasmonics for improved sensitivity of chemical/biological sensor relying on shift in plasmonic resonance intensity or frequency. Lastly, the present invention has a possible use in enhanced SERS (surface-enhanced Raman scattering/spectroscopy).

The nanowire has been fabricated with dimensions: wire diameter ~700 nm, wire height 1-20 μm, pitch 2-15 μm. Future development of the present invention includes two types of solar cells utilizing the aluminum nanowire array (ANA), including a nanocoax dye sensitized solar cell and to deposit $BiVO_4$ thin films onto ANAs to test their viability to improve a water-splitting photoelectrochemical cell. Further studies will test the viability of aluminum nanowire arrays as an electrolyzer electrode by depositing earth abundant catalysts onto them.

Metal nanowire arrays with vertically oriented and laterally ordered nanowires were fabricated via a lithographically controlled anodization of aluminum oxide. It was found that upon anodization of Al that was imprinted with an array of indents, the absence of an indent protected the underlying Al from anodization. Thus, upon etching the anodized alumina, Al nanowires would be left where indents had been absent. These Al nanowires access dimensions previously inaccessible to metal nanowires and show promising attributes for certain electrical and optical applications.

Without further elaboration, it is believed that one skilled in the art can, based on the above description, utilize the present invention to its fullest extent. The following specific embodiments and examples are, therefore, to be construed as merely illustrative, and not limitative of the remainder of the disclosure in any way whatsoever.

EXAMPLES

The following examples are provided to illustrate embodiments of the present invention but are by no means intended to limit its scope.

The examples described herein will be understood by one of ordinary skill in the art as exemplary protocols. One of ordinary skill in the art will be able to modify the below procedures appropriately and as necessary.

Novel Fabrication Process

Figure 3:
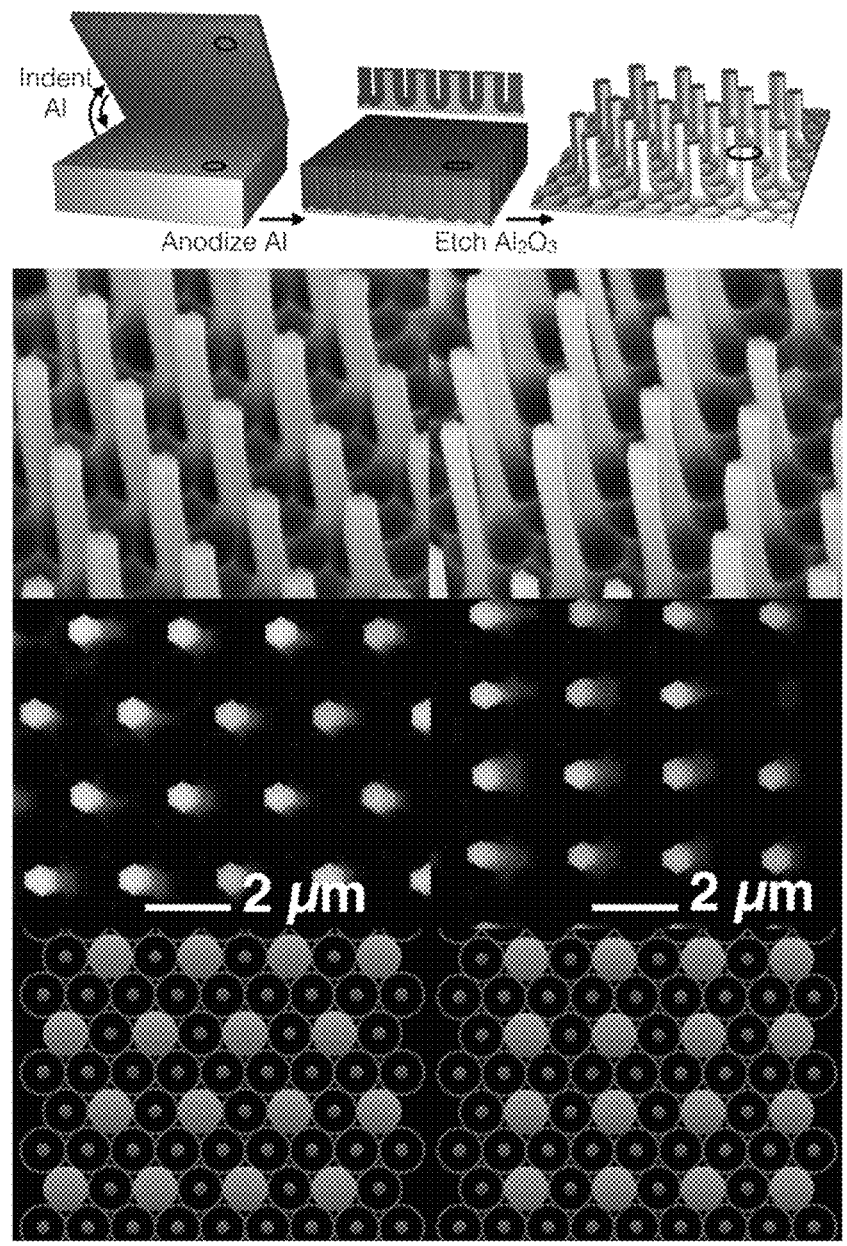
FIG. 3 shows (Top) a fabrication process cartoon depicting the "missing indent" method of Al nanowire formation. (Middle) SEMs of resulting Al nanowire arrays in a (left) hexagonal lattice and (right) square lattice. (Bottom) Diagram demonstrating how the same underlying matrix (i.e. a hexagonal array of pores) can produce different lattice geometries of nanowires. Green dots emphasize that all the nearest neighbors of these nanowires were pores.

Fabrication of an Al nanowire requires blocking the formation of a pore when growing an anodized alumina template (AAT). An AAT consists of a layer of aluminum oxide with an array of pores passing through the thickness of the oxide. The oxide is grown by anodizing an Al surface, and the pores form during the anodization process due to a positive-feedback process. Well-ordered pores can be obtained by patterning the surface of an Al substrate with an ordered array of indents. Numerous works have documented this process in great detail. The array of indents is typically arranged in a hexagonal lattice. When the Al is anodized, pores nucleate at the indents, creating a well-ordered array of pores. Three methods are demonstrated here to block the formation of a pore in a well-ordered AAT: (1) embedding material into an indent prior to anodization, (2) preventing the formation of an indent at a lattice site, and (3) masking the Al with a dielectric film at a lattice site. In either case, the Al below the affected site is protected from oxidation while the surrounding Al is anodized. This creates an Al wire embedded in the AAT, as shown in FIG. 3. Selectively etching the alumina leaves a freestanding Al wire. Al wires can be as far from each other as the lateral dimensions of the AAT allows, and have been demonstrated as close to each other as separated by only one anodized pore.

Figure 4:
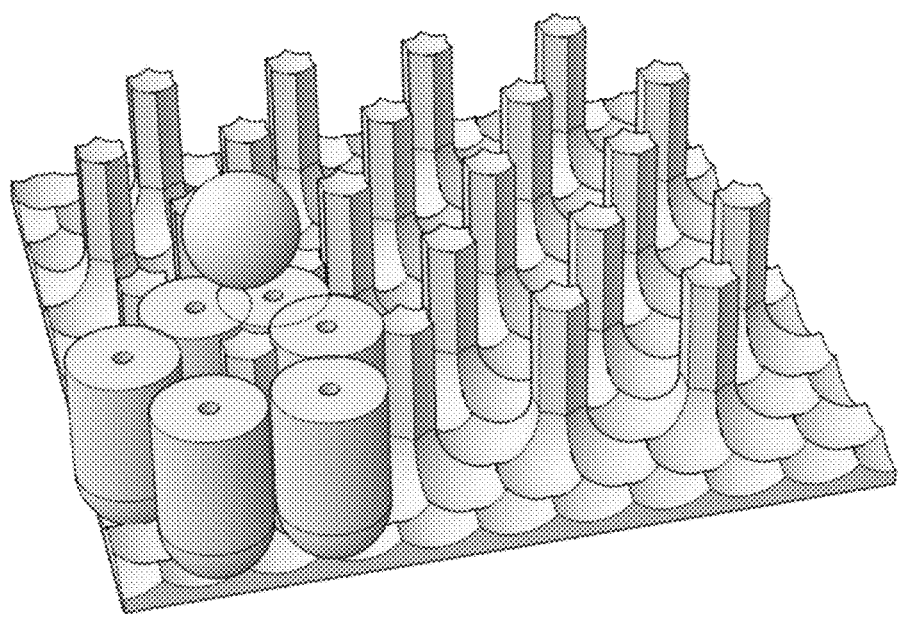
FIG. 4 shows a cartoon demonstrating the subtraction of cylinders with hemispherical bases from the bulk aluminum, which produces the cross-section of the aluminum nanowires.
Figure 5:
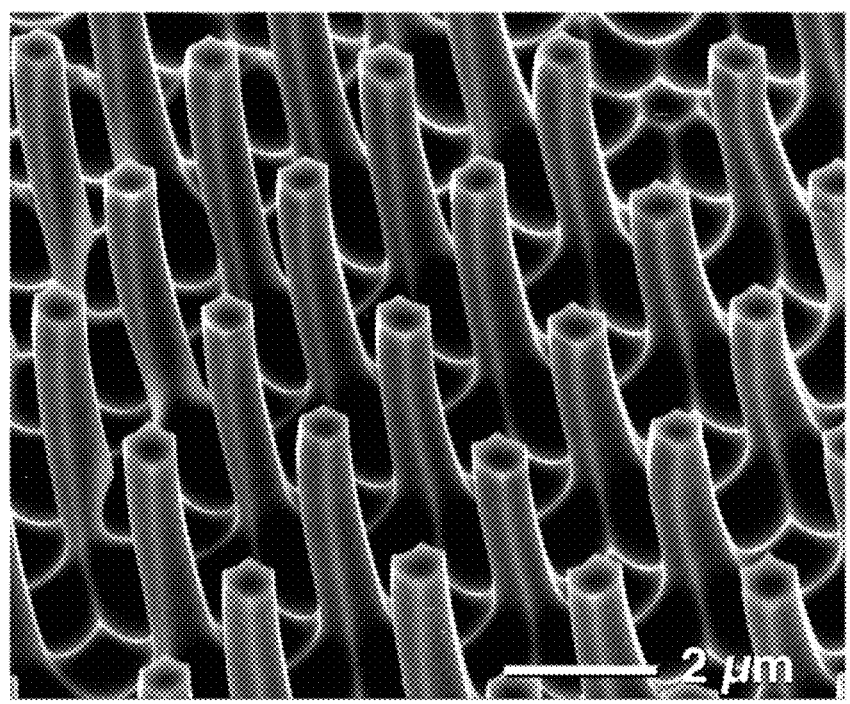
FIG. 5 shows bright edges on Al nanowires highlight the sharp edges located throughout the structure. The missing nanowire defect at the top right provides a view of the configuration of the texture at the base of the nanowires.
Figure 6:
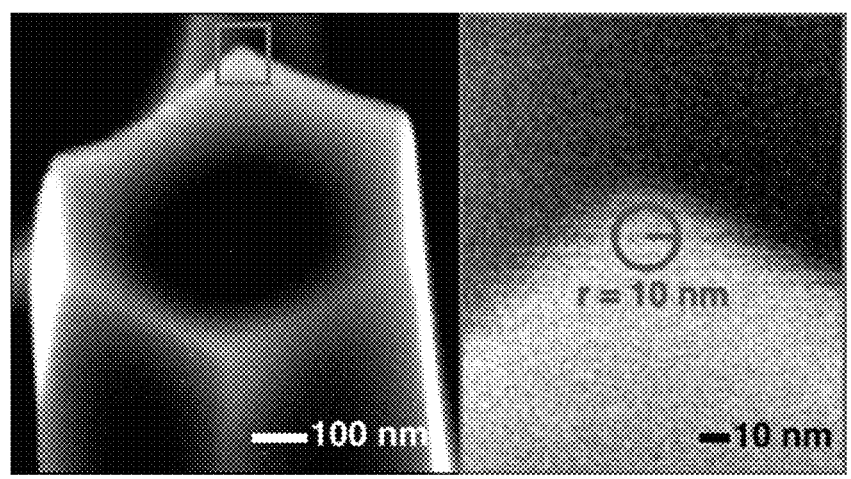
FIG. 6 shows the high resolution SEM image of the top of the nanowire shows the radius of curvature of the crown points to be ~10 nm. The edges running the length of the nanowire appear to have a similar sharpness.

All methods for preventing aluminum oxidation utilized the same preparation of the Al surface and anodization procedures. They varied only in the process used to pattern the Al surface with indents. Method 1 utilized a stamp with an array of Si pillars, which would randomly break off the substrate and become embedded in the aluminum surface during the imprint procedure. Method 2 was developed to control the placement of aluminum nanowires. It utilized a stamp with an array of Ni posts on a Ni-coated-glass surface, fabricated via electron beam lithography (EBL), which provided the ability to leave out certain posts from the array. Since the natural packing configuration of the pores in an AAT is a hexagonal lattice, a hexagonal array of Ni posts was used for imprinting the aluminum. From this underlying matrix, both square and hexagonal arrays of aluminum nanowires were fabricated, as shown in FIG. 3. Method 3 was developed to enable the use of a soft stamp to pattern a soft film on the Al surface, incurring significantly less wear on the stamp than hard stamps indenting the Al directly; this process also has promise of producing Al NWs with a lower minimum pitch. Geometrically, the aluminum nanowires are the result of subtracting cylinders with hemispherical bases from the bulk aluminum, as shown in FIG. 4. For a hexagonal array of pores, this produces aluminum nanowires with a hexagonal cross-section. The oxidation of the Al is well confined to these cylinders, creating edges with a small radius of curvature in comparison to the nanowire diameter. Additionally, all the nanowire surfaces are concave, causing the edges to have a lower bevel angle than a true hexagon. Combined, the low radius of curvature and low bevel angle create very sharp edges, as shown demonstrated in FIG. 5 by the strong secondary electron signal at these edges in comparison to the faces of the nanowires. The top face of the nanowires is also concave, producing a 6 pointed crown shape. These points can be imaged well in the SEM, and their radius of curvature was measured to be ~10 nm on a nanowire with a 700 nm diameter, as shown in FIG. 6. The edges running the length of the nanowires appear to have a similar radius of curvature from the SEM image. These edges may be valuable for photonic applications, such as electric field enhancement due to geometric confinement of electric field lines.

Conductivity

Conductivity will be measured by isolating an Al nanowire laying on its side on a silicon or silicon oxide wafer. Four contacts will be made to the nanowire using Kleindiek probes in the focused ion beam (FIB) (JEOL USA), allowing for conductivity of the wire to be measured at room temperature.

Elemental Composition & Crystal Structure

The elemental composition and crystal structure of the nanowires may be measured via three methods. First, they may be dispersed onto a silicon wafer and measured via XRD. $SiO_2$ is not used so that, besides the $SiO_2$ passivation layer on the Si, any oxide content can be attributed to the Al wires. Second, a Transmission Electron Microscope (TEM) with an EDS system may be used to measure the elemental composition and crystal structure of a single Al nanowire. Finally, a Scanning Electron Microscope (SEM) with an EDS system (from JEOL) may be used to measure the elemental composition of the Al nanowires (this method has limited capabilities, as there is always an Al signal artifact in the SEM EDS as a result of the Al vacuum chamber).

Plasmonic Properties

Figure 13:
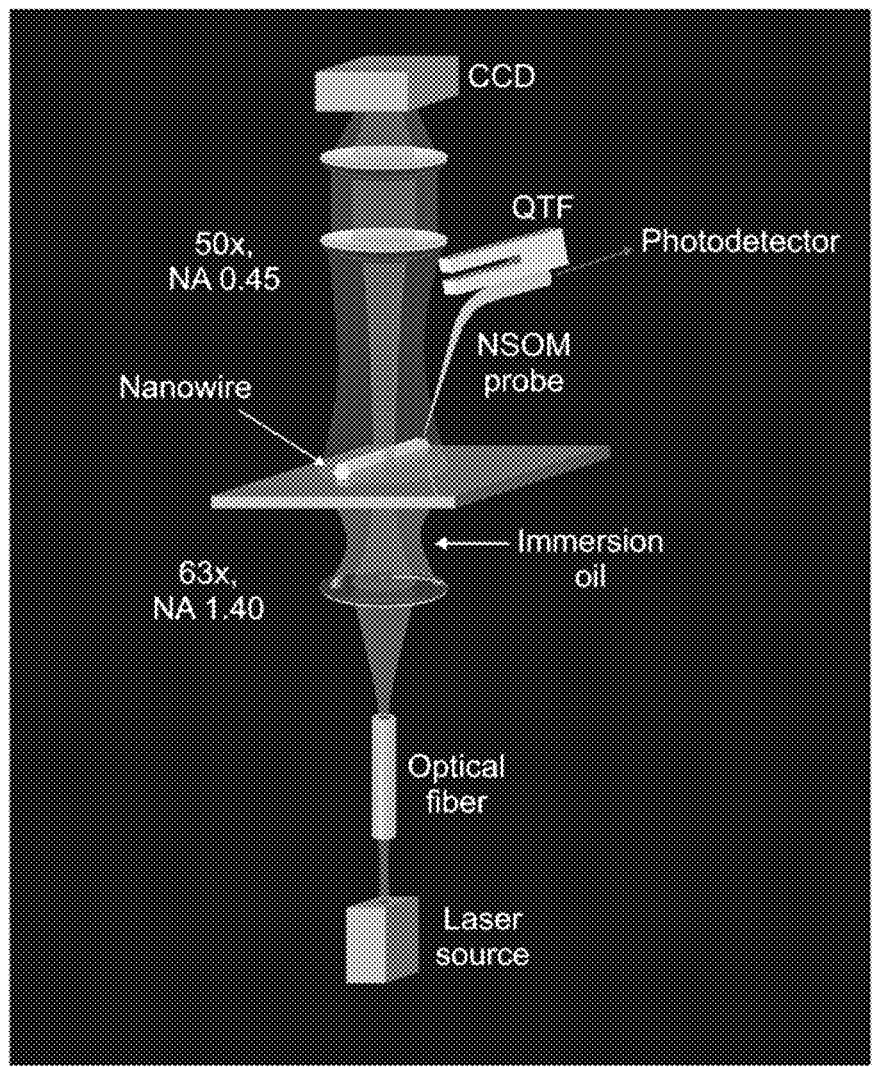
FIG. 13 shows schematic of experimental setup for NSOM measurements of an Al nanowire. A Nanonics Imaging Ltd. MultiView 4000 NSOM was used to illuminate the nanowire with a 660 nm wavelength laser source. A single-mode optical fiber, diameter 4 μm, coupled light from the laser into a 63×numerical aperture (NA)=1.40 objective below the Al nanowire. Laser light passed from this objective, through immersion oil and a glass slide to form a spot in a focal plane containing the Al nanowire. Far-field radiation from the laser spot was observed by a charge-coupled device (CCD) camera through a 50×NA=0.45 objective above the nanowire. Near-field radiation at the nanowire and glass surfaces was measured by an NSOM probe (500 nm aperture, 150 nm Cr—Au coating, multimode fiber).

To elucidate the plasmonic properties of the Al nanowires, measurements with a near-field scanning optical microscope (NSOM), an atomic force microscope (AFM), and a conventional optical microscope (imaged onto a CCD) were taken of an isolated nanowire lying flat on glass and illuminated by a laser spot with a 660 nm wavelength (FIG. 13). The nanowire height (AFM signal), encoded as the color scale in FIG. 14a, shows lengthwise ridges running along the nanowire; the electric field intensity (NSOM signal), encoded as the topography of FIG. 14a, shows evidence of surface plasmon polaritons (SPPs) propagating from the laser spot along the nanowire length at the ridges. The apparent AFM signal modulations along the nanowire length are the artifact of the shading effect from the overlying NSOM pattern. A line-cut of the NSOM signal along a ridge (FIG. 14b) shows the SPP standing wave pattern with wavelength of ~550 nm. Simulations (not shown) predict the SPP wavelength to be 600 nm for an Al nanowire coated by 3-5 nm of aluminum oxide and illuminated by 660 nm radiation. Images taken with the conventional optical microscope (FIG. 14c) show light scattering from the nanowire tip with increasing intensity as the tip is moved closer to the laser spot, providing evidence that light is coupled from the laser spot to SPPs on the nanowire, and scattered into photons at the nanowire tip.

The large wavelength of the standing wave pattern in FIG. 14b (approaching the SPP wavelength) results from the large (compared to SPP wavelength) circumference of the wire. This causes the back-scattered SPP waves to have small axial components of their wave vectors, and therefore the resulting standing wave along the wire has its wave vector dominated by the incoming wave. This also explains the rapid decay of the standing wave pattern (with exponential decay range of ~1 μm), as shown in FIG. 14b; due to the large wire circumference, only a small fraction of the SPP back-scatters into the original (along the wire ridge) propagation channel, to produce the scattering wave pattern. This, with increasing distance away from the excitation point, effectively depletes the ridge propagation channel of back-scattered plasmon waves. This evidence of SPPs supported on and guided along an Al nanowire demonstrates the potential efficacy of these Al nanowires for plasmonic device applications, such as a waveguide for light.

Example 1

Field Enhancement

A major application of metal nanostructures is enhancement of the electric field from radiation incident on the structure. In sensors this field enhancement improves the signal strength by enhancing interactions between the radiation and the target species that is in proximity of the nanostructure (e.g. SERS, SPR). In solar cells this field enhancement improves the absorption of the radiation by the solar absorber (e.g. a semiconductor or dye molecule).

Figure 7:
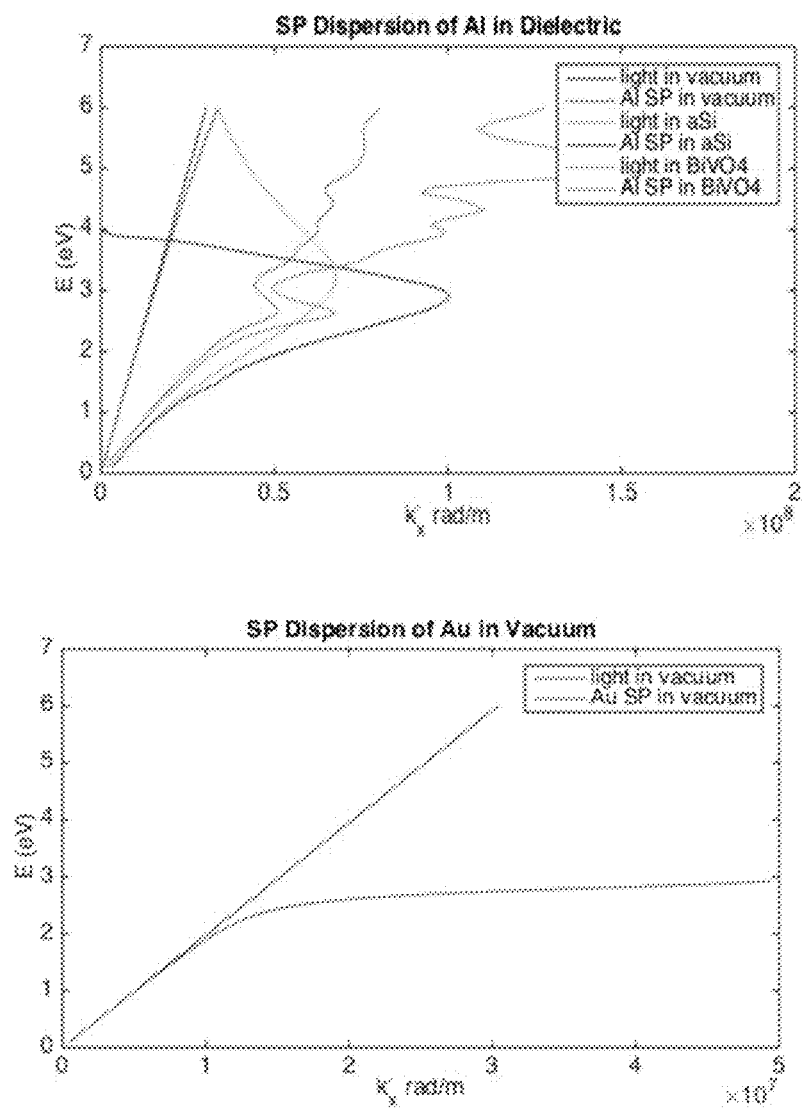
FIG. 7 shows surface plasmon dispersion curves for planar Al and Au in various dielectric environments. Comparison of light lines to surface plasmons in coated Al suggests that there may be plasmonic field enhancement near the visible on Al nanostructures coated with a-Si or $BiVO_4$.
Figure 8:
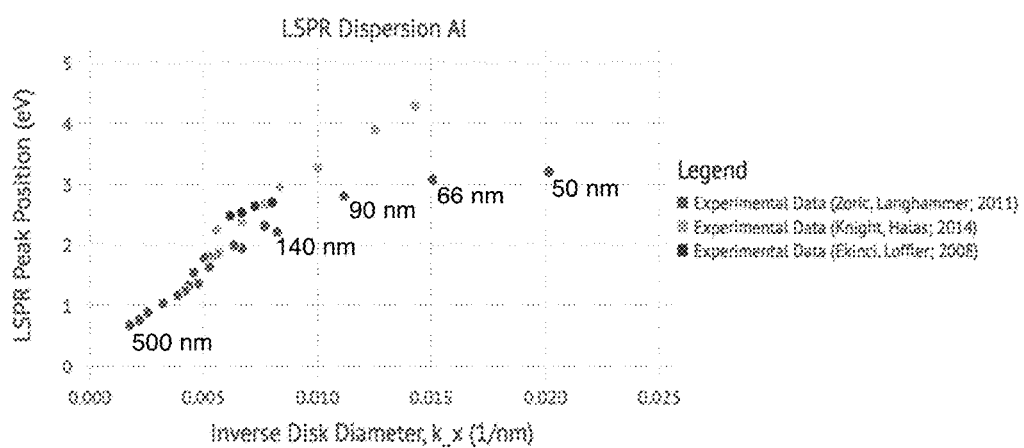
FIG. 8 shows dispersion of surface plasmons on Al in vacuum, determined from the peak absorption frequency for localized surface plasmons on Al disks of various radii.

There are two mechanisms for field enhancement with metal nanostructures: geometric confinement of electric field lines at sharp edges and excitation of plasmonic resonances. The former is relevant when the dispersion relation of surface plasmon polaritons (SPPs) is photonic in nature, nearly matching the light line as shown for Al in vacuum from 0 to 6 eV in FIG. 3. In this regime, the metal acts as a perfect electrical conductor (PEC), the electric field has negligible penetration into the metal, and the interaction of light with the metal nanostructure is the same as that of radio waves with macroscopic metal structures. In such circumstances the electric field lines are always perpendicular to the metal surface. When a low radius of curvature is created on the metal surface, the electric field lines are condensed to a small volume, enhancing field strength. To first order, the field strength is inversely proportional to the radius of curvature, $E \sim r^{-1}$. For a surface with radius of curvature r=500 nm containing a sharp edge of radius of curvature r=5 nm the field enhancement at that point will be $\sim 10^2 \times$. The latter mechanism, excitation of plasmonic resonances, is relevant when the dispersion relation of SPPs is plasmonic in nature, having a shallower slope than the light line. The canonical example of this dispersion is demonstrated in FIG. 7 by the gold surface in vacuum. As the dispersion asymptotically approaches the SPP resonant frequency, the density of states for SPPs becomes substantially larger than that of the light line. Provided sufficient coupling between the incident photons and SPPs, energy will be concentrated on the metal surface and thereby enhance the electric field strength. Maximum enhancement is found at the SPP resonant frequency, $\omega_{spp}$. The enhancement can be increased in strength and shifted in frequency by confining the SPPs to geometries with subwavelength dimension, referred to as localized surface plasmon resonance (LSPR). LSPR can cause field enhancement of $10^5 \times$ near the SPP resonant frequency, 1000 times more enhancement than can practically be achieved by geometric confinement of field lines. In the case of SPPs the electric field is no longer perpendicular to the surface and the analysis of field concentration at sharp edges described above is no longer applicable. For frequencies between the photonic and plasmonic regimes, it is anticipated that a combination of the two field enhancement mechanisms will be observed.

Finding a means to use Al for electric field enhancement is desirable due to its earth abundance and low cost. Two avenues exist for accomplishing this objective: creating sufficiently sharp edges to realize the moderate field enhancement offered by geometric confinement of electric field lines, and embedding the Al into dielectric materials of sufficiently high dielectric constant that the SPP resonant frequency is lowered near to the visible range. The former has not been accessible by previous studies because the metal structures have been deposited into templates. Except in the cases of crystal faceting and kinetically-driven dendritic solidification, edges tend to maximize their radius of curvature during material deposition to minimize the surface energy of the structure. This limits the formation of sharp edges in structures fabricated via template-based processes.

The invention may also be carried out utilizing sharp edges and corners. The sample may include: vertical ANA and Hex cross-section. This may also involve: Near-field Scanning Optical Microscope (NSOM) and simulate field enhancement at 6 crown points, bare Al, Au coated Al, and Ag coated Al. Here, a NSOM from Nanonics is used to measure the electric field strength at the surface of an array of Al nanowires. Strong field enhancement is expected at the 6 "crown points" at the top of each nanowire. The nanowires may be coated in Au to improve plasmonic field enhancement from localized surface plasmon resonance (LSPR). The software packages CST and COMSOL will be used to model the electric field at the nanowire surface.

Figure 14:
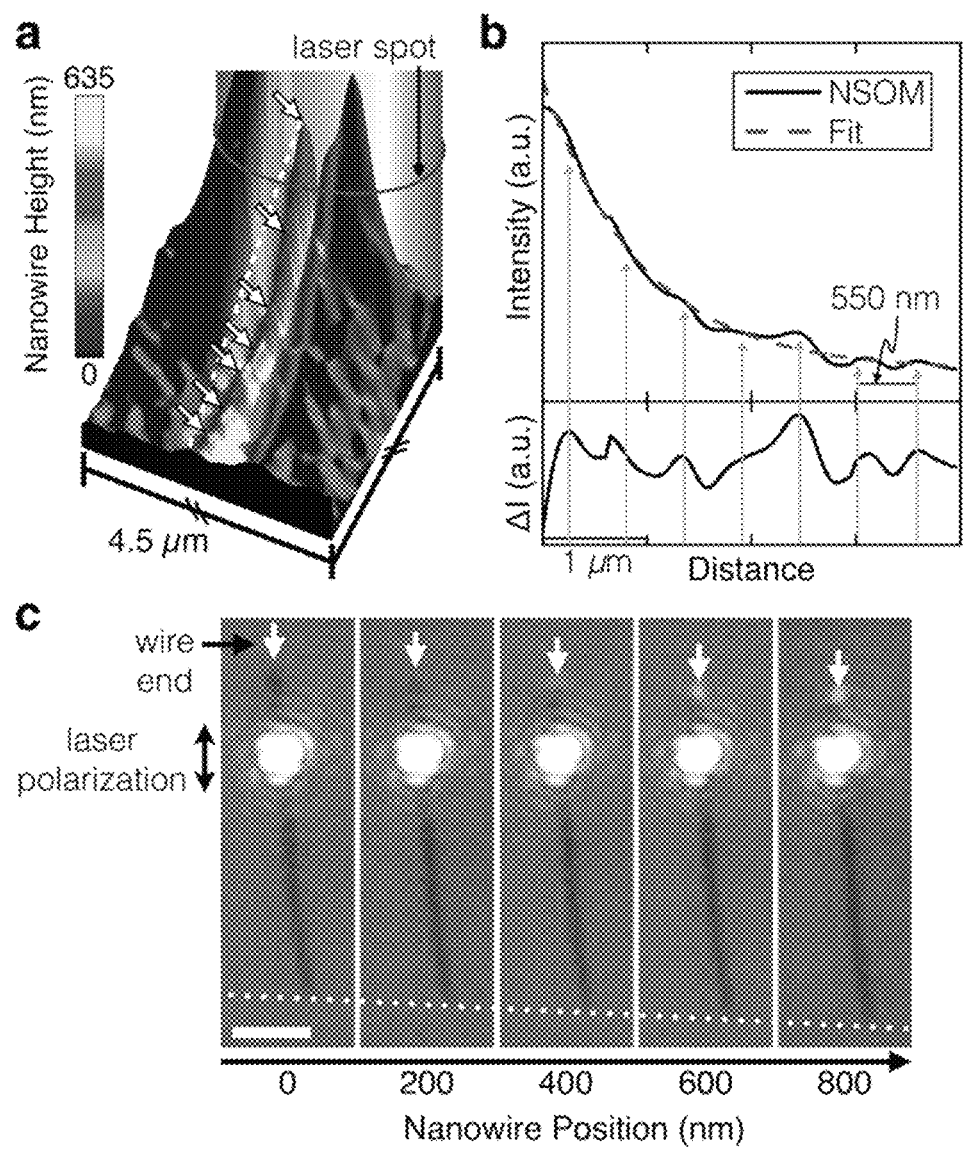
FIG. 14 shows optical and AFM measurements of an Al nanowire on a glass slide and illuminated by a laser spot of wavelength 660 nm; laser polarization is along the wire axis to excite longitudinal SPP modes. (a) A composite NSOM and AFM signal: figure topography shows NSOM signal, i.e. near-field optical intensity; color scale shows height of Al nanowire (red & yellow) and glass surface (blue), as measured by AFM. A yellow streak running lengthwise along the wire in the red region shows evidence of a ridge along the nanowire. White arrows highlight antinodes of standing waves on this ridge, formed by forward and backward propagating SPPs, which are created by the laser spot and reflection off the nanowire tip, respectively. (b, top) Black solid line shows line-cut of near-field optical intensity (NSOM) along dashed line in (a), demonstrating a standing wave of 550 nm wavelength in superposition with an exponentially decreasing intensity with increasing distance from the laser spot; red dashed line shows exponential fit that measures the standing-SPP decay length to be ~1 μm. (b, bottom) ΔI, the near-field optical intensity minus the exponential fit, shows the standing wave with greater clarity; grey arrows spaced by 550 nm highlight antinodes. (c) Far-field images of the Al nanowire under the laser spot show increasing light scattering from the Al nanowire tip with decreasing distance between the laser spot and the tip, likely due to SPPs propagating from the laser spot and scattering off the nanowire tip into photons; scale bar 2 μm.

While utilizing the invention with sharp edges and corners, the sample may include: Hex Al Nanowires lying sideways on Si (and/or glass) and involve NSOM and simulate edges that run the NW length. The simulations may include the following: 700 nm diam, Hex cross-section, (a) $k_i \| axis$, (b) $k_i \perp axis$, radius of curvature (i) 1 nm, (ii) 10 nm, (iii) 40 nm, (iv) 100 nm. Plot $E_{mag}$ vs. position along a line that follows the cross-section contour, 10 nm away from wire surface. Compare that with the $E_{mag}$ at the same distances from a flat plane of Al. This is the same as above, except the wires will be removed from the Al substrate and dispersed onto a Si or $SiO_2$ substrate, such that the wires are laying on their side and the electric field can be measured at the edges that run the nanowire length. FIG. 14 shows experimental evidence of electric field enhancement and standing SPPs on the edge of an Al nanowire.

The invention may also be carried utilizing localized surface plasmon resonance. The sample may include: $\sim 100 \times$ 100 µm area of Al nanowire array. This may also involve: circular disk LSPR modes. This may also involve: vertical ANA, white light incident k∥axis of wires, measuring reflection intensity spectrum vs. nanowire diameter by etching Al wires to reduce diameter. The sample may also involve: long wire modes (NanoAntennae) and vertical ANA, white light incident at k 60° to axis of wires, to measure light intensity vs. rotation angle of polarizer (placed between sample and camera) or to measure reflection intensity spectrum vs. nanowire height (depends on sufficiently uniform Al Nanowire height over large enough area).

The invention may be carried out utilizing incident radiation normal to surface. When illuminated normal (90°) to the array plane, the Al nanowires may exhibit localized surface plasmon resonance (LSPR) modes with plasmon wavelength equal to an integer fraction of the nanowire circumference. When the nanowire array is illuminated with a broadband light source, dips in reflection may be observed at the wavelengths at which LSPR modes are excited. Thus, as the nanowire diameter is reduced by isotropically etching the nanowires, the LSPR absorption peaks should shift in wavelength.

The invention may be carried out utilizing incident radiation off-normal to surface. The Al nanowire array should act as a dipole antenna array. Dipole antenna has certain properties, which should be able to be observed in the Al nanowires if they indeed act as optical nanoantennas. First is the polarization effect—that electromagnetic waves polarized parallel to the antenna axis will exhibit specular reflection, while waves polarized perpendicular to the antenna axis will exhibit diffuse reflection. Second is the length matching effect, that the antenna response is maximized when the length is a multiple of the radiation half-wavelength. Thus, if the nanowires are illuminated with a broadband light source, the wavelength of spectrally reflected light should shift as the nanowire height is varied. Variation in the nanowire height may be obtained by finding regions in the array that have different nanowire heights, by isotropically etching the nanowires, or by polishing down the nanowire tops.

The invention may be carried out utilizing plasmon propagation length. The sample may include: Al nanowires lying sideways on (Si and/or) glass. This may involve laser illumination on end of wire, and measuring emission from other end. This may involve measuring emission intensity vs. wire length (finding scraped wires of different length) or measuring emission intensity vs. wire diameter (etch wires before or after scraping to reduce diameter). FIG. 14 shows experimental evidence of an Al NW with its as-grown diameter and cross-section propagating laser light from an incident laser spot to the Al nanowire tip.

Metal nanowires have been demonstrated to act as optical waveguides, functioning as Fabry-Perot resonators. By illuminating one end of an Al nanowire with a tightly focused laser spot, this phenomenon should be observed for Al nanowires. By illuminating wires of different lengths, the propagation length should be able to be determined. By isotropically etching the nanowires a diameter dependence may be observed for the nanowire propagation length. This may be conducted on Al nanowires laying on their side, dispersed on a Si or $SiO_2$ wafer.

Experimental Methods

Method 1: Masked Indent

Si pillars were used to imprint the Al surface with an array of indents. During the imprint process, a random assortment of Si pillars would become embedded into the Al surface. The Si pillar would protect the underlying Al from anodization, causing the formation of Al nanowires.

Stamp: Si nanopillars (conical shape, 200 nm diameter at top, 400 nm at base) had ~500 nm of spin-on-glass (SOG312B from Honeywell) spun on to fill the space between the pillars and provide structural support. Spin parameters were 3000 rpm for 30 s, followed by baking at 250° C. for 1 min, and baking at 423° C. for 1 hour.

Method 2: Missing Indent

Ni posts were used to imprint the Al surface with an array of indents. Ni was used because it was compatible with an electron-beam lithography technique for fabricating an array of posts with control of post placement. Thus, Ni posts could be left out of certain lattice sites in the array. Thus, after imprinting the Al, there would be missing indents in the Al at certain lattice sites in the array of indents. This would prevent the Al from anodizing at the site of a missing indent. Based on FIG. 12, it is suggested that there is a maximum indent diameter for which electrical current is sufficiently concentrated at the indents to selectively nucleate pores at these sites, and prevent pore nucleation at the sites missing an indent.

Stamp: Glass slides 16 mm×15 mm were piranha cleaned and then coated with 50 nm of Ni with a Sharon electron beam deposition system. HMDS (VLSI grade 0.1 μm filtered from Ultra Pure Solutions, Inc.) was spun on (step 1: 5 sec, 500 rpm, 100 rpm/sec, step 2: 45 s, 4000 rpm, 550 rpm/s) to remove moisture from the sample surface, followed by electron beam resist (950 PMMA A4 from MicroChem) spun on (step 1: 5 s, 500 rpm, 100 rpm/s, step 1: 45 s, 4000 rpm, 550 rpm/s) to create a nominally 200 nm thick PMMA film. A 120 s delay between applying the PMMA and initiating the spin steps was included to allow bubbles in the PMMA to dissipate. The PMMA was then pre-expose baked at 180° C. for 25 min on a hotplate. Arrays of 100 nm diameter holes were written into the PMMA with a JEOL SEM using a dosage of ~1300 μC/$mm^2$. The PMMA was then developed with 1:3 MIBK:IPA (MIBK/IPA 1:3 Developer from MicroChem) for 40 s, IPA for 20 s, and finally DI water for 20 s. Ni was then electroplated into the holes with Ni plating solution (SN-10 Ni Plating Solution from Transene, Inc.) to produce 80 nm tall Ni posts. The PMMA was then dissolved by placing the stamp in a bath of acetone for a few minutes.

Method 3: Patterned Mask via Soft Stamp

The polished Al surface was coated by 300 nm of $Al_2O_3$ via atomic layer deposition (ALD) and spin-coated with 300 nm of SU8 negative photoresist. This SU8 layer was patterned by a PDMS stamp with an array of pyramids in the same arrangement as the posts in the Ni stamp above. The SU8 was etched to expose the $Al_2O_3$ at the sites of the PDMS pyramids, and the $Al_2O_3$ was etched through these openings. The sample was then anodized, and pores were found to form at the sites of etched $Al_2O_3$ and not at sites protected by the $Al_2O_3$ and SU8 mask.

Mask: The polished Al surface was cleaned by sonication in acetone, rinsing in isopronanol, and rinsing in deionized water. It was then coated with 300 nm of $Al_2O_3$ via atomic layer deposition (ALD) (Cambridge NanoTech, Inc. Deposition chamber 125° C., 3000 cycles: 15 ms Trimethyl Aluminum, 5 s wait, 15 ms $H_2O$, 5 s wait) and spin-coated (step 1: 7 s, 110 rpm/s ramp, 500 rpm spin; step 2: 30 s, 550 rpm/s ramp, 3000 rpm spin) with 300 nm of SU8 2002 negative photoresist, which had been diluted to 8 wt % solids with SU8 thinner (cyclopentatone). The SU8 was soft-baked on a hotplate at 65° C. for 5 min and 95° C. for 90 s to remove the solvent, imprinted by the PDMS stamp via a vice with a glass top, heated on hotplate at 95° C. for 5 min, exposed to UV radiation for 75 s, heated on a hotplate at 95° C. for 5 min, cooled on a lab-bench for 40 min, released from the PDMS stamp, exposed to UV radiation for 75 s, and hard baked for 2 min each at 65° C., 95° C., 120° C., 150° C., 180° C., for 60 min at 210° C., and for 2 min each at 180° C., 150° C., 120° C., 95° C., 65° C., and left on hotplate to cool to 40° C. The SU8 was then dry-etched in a barrel etcher (PVA TePla America, Inc. PS 210 Microwave Plasma System) for 30 s, at 250 W, with 150 sccm $O_2$ and 20 sccm $CF_4$, in a Faraday cage on a $SiO_2$ plate. The exposed $Al_2O_3$ was wet-etched for 100 min in 1.8 wt % chromic acid +6.0 wt % phosphoric acid on a hotplate set to 65° C.

Stamp: A Si <100> wafer was cleaned by sonication in acetone, rinsing in isopronanol, rinsing in deionized water, drying in an $N_2$ stream, and drying on a hotplate at 200° C. for 5 min. 50 nm of Cr was deposited onto the surface by ebeam deposition (Sharon, Inc.). The cleaning procedure was repeated, and 180 nm of 495 PMMA A4 (filtered by 0.45 um PALL Nylon Acrodisk and plastic syringe) was spun onto the Cr (step 1: 7 s, 110 rpms/s ramp, 500 rpm spin; step 2: 30 s, 550 rpms/s ramp, 3000 rpm spin). The PMMA was soft baked for 90 s on a hotplate at 180° C., and a pattern of 300 nm diameter circles was written in the PMMA with a JEOL SEM (30 kV accelerating voltage, 700× magnification, probe current 14, working distance 10 mm). The PMMA was developed for 60 s in (1:3 MIBK:IPA, no stirring) followed by 20 s in IPA (brief stir in last 2 s). The Cr film was etched in Transene Cr Etchant 1020 at 40° C. for 15 s, rinsed with deionized water, and dried with an N₂ stream. The PMMA was removed by immersion in acetone for 5 min. The native oxide of the Si was etched for 60 s in buffered oxide etch (BOE:7:1 NH4:HF), rinsed briefly in two separate baths of deionized water, and immediately afterwards the Si was etched for 5 min in 40 wt % KOH solution at 50° C. to produce an array of negative pyramids. The Cr film was removed by etching in Transene Cr Etchant 1020 for 2-5 min. Sylgard 184 silicone elastomer base was mixed with its curing agent (10:1 ratio), degassed in a vacuum chamber for 10-15 min, and poured over the the patterned Si. The PDMS was cured for 2 hours on a hotplate at 75° C. The area of the PDMS with the negative of the pyramid pattern in the Si was then cut out of the PDMS film to create the "PDMS stamp". A non-stick release layer was applied to the PDMS stamp by: sonicating the PDMS in isopropanol, rinsing the PDMS in deionized water, drying the PDMS in an N₂ stream, drying the PDMS on a hotplate at 120° C., adding two drops of 1H,1H,2H,2H-Perfluorodecyltrichlorosilane, 96% from Alfa Aesar (L16584) to 25 ml of n-Heptane, immersing the PDMS into the n-Heptane for 5 min, immersing the PDMS in acetone for 5 min, and drying the PDMS on a hotplate at 120° C. This produced a functional PDMS stamp for imprinting SU8 films.

Al Preparation and Anodization

Electropolish Al: High purity Al foil of thickness 250 μm was cut into 5 mm×10 mm strips using scissors. The strips were flattened between two glass slides using a custom-made vice composed of two flat Al plates, one of which can be moved vertically by turning a 5 mm diameter screw. The Al foil was then rinsed with ethanol to remove moisture from the surface and immersed in a bath of 1:3 perchloric acid:ethanol (70% perchloric acid, 95% ethanol), which was stirred at 120 rpm with a 10 mm magnetic teflon coated stirring rod and held at 5° C. via a jacketed beaker and circulating bath (Polystat 1212202 from Cole Parmer). A 4 mm diameter 30 mm length carbon rod was simultaneously immersed in the solution as a counter electrode. Electrical contact was made to the Al foil and C rod via flat-tipped alligator clips (Micro 1⅛" Smooth Clips from Radioshack). 10-20 V was applied with a high current voltage source (Kepco model: KS36-10M current regulated power supply) for 5-10 min (voltage and time were fine-tuned each day electropolishing took place).

Imprint Al: Using the custom-made vice and two glass slides, as above, but with the polished Al foil placed polished-side-down on top of the Ni stamp (with posts facing up) and a small piece of teflon tape (2 mm×2 mm) placed on top of the Al where it will be imprinted. The vice was carefully closed to compress the Al against the Ni stamp and imprint the Al.

Anodize Al: The Al foil is placed in a beaker of: 50 ml ethylene glycol, 50 ml 2% wt Citric acid, 2.9 ml 0.1% wt phosphoric acid, that is held at 10° C. via a jacketed beaker and circulating bath. For AAT pore spacing of 1.2 μm, 480 V is applied between the Al foil and a carbon counter electrode (Al positive electrode) for a duration appropriate for the desired height of the Al nanowires (~0.8 μm/hr). At the start of anodization, the applied voltage was ramped from 0 V to 480 V as follows: 80 V for 90 s, 180 for 90 s, 280 V for 90 s, 380 V for 90 s, 480 V.

Etch Al₂O₃: The anodized Al foil is rinsed with DI and placed for 50 minutes in a beaker containing 50 ml of 6% wt phosphoric acid and 1.8 wt% chromic acid in DI held at 63° C.

Final Rinse: The Al foil is rinsed with DI and dried by flowing a nitrogen stream across it. The Al nanowires are now exposed and can be SEMed. An iridescence will be apparent where there are Al nanowires.

Example 2

Al Nanowire Results

Method 1

Figure 9:
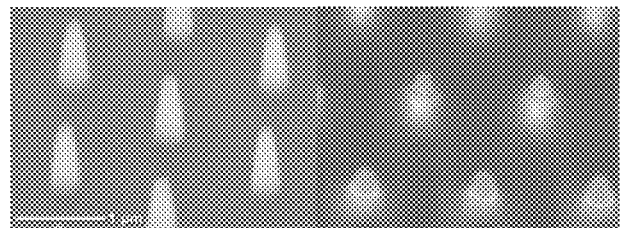
FIG. 9 shows (Left) a bare Si pillar array. (Right) Shows a Si pillar array with supporting SOG filling the space between pillars, used to imprint Al. Scale same in both images.
Figure 10:
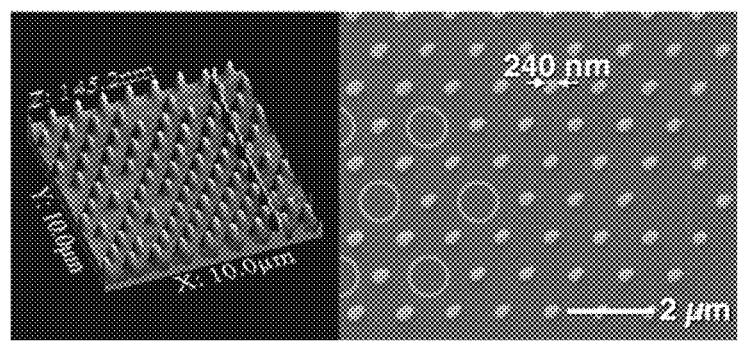
FIG. 10 shows a Ni post array with hexagonal lattice with 7-site hexagons of missing Ni posts. (Left) AFM, (Right) SEM.
Figure 11:
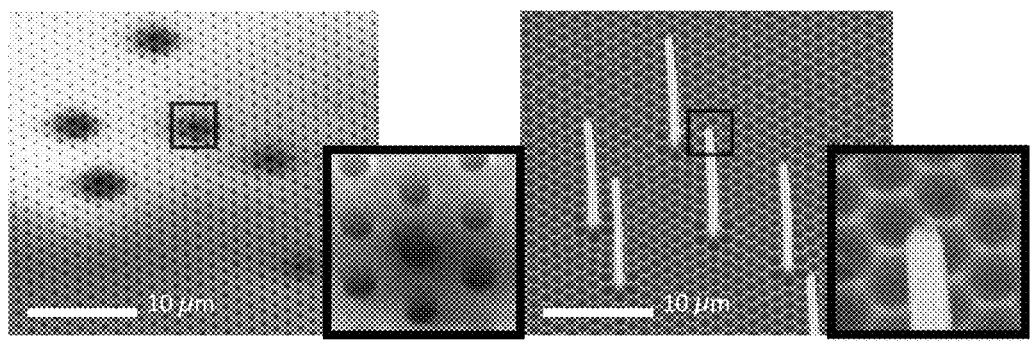
FIG. 11 shows (Left) AAT with Si nanopillars embedded in various pores (seen in the inset). (Right) the resulting Al nanowires generated by the presence of the embedded Si nanopillars.

Shown in FIG. 11 below is an AAT with a Si pillar embedded into the template, and the corresponding Al nanowire that formed as a result of the Si pillar preventing the nucleation of a pore at that site. An SEM of the Si pillar stamp is shown in FIG. 9.

Method 2

Figure 12:
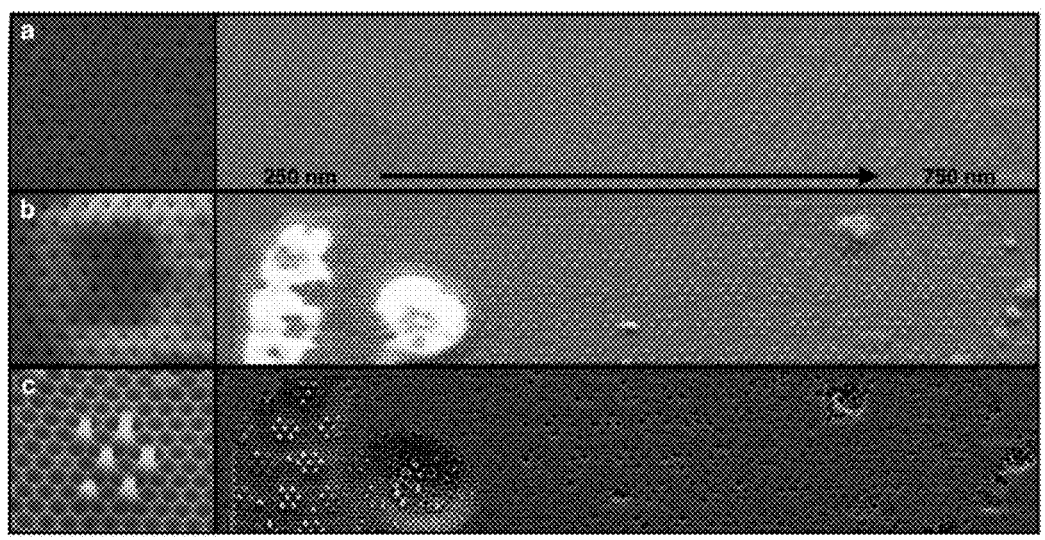
FIG. 12 shows scanning electron micrographs showing the dependence of Al nanowire growth on imprint post diameter. Going from left to right, the imprint posts ranged in diameter from 250 nm to 750 nm. Images show fabrication steps: (a) imprinted Al, (b) anodized Al, (c) etched Al substrate, exposed by etching away the alumina. For a stamp pitch of 1.2 μm, the imprint post diameter must be ≤400 nm.

As shown in FIG. 12 below, it was found that Al nanowires only formed (under anodization conditions for 1.2 μm pore-to-pore pitch) when the diameter of the Ni posts used to indent the Al surface was ≤400 nm. See the SEMs in FIG. 3 for higher aspect ratio Al nanowires fabricated via this process.

Example 3

Al Nanowire Array Fabrication

Figure 15:
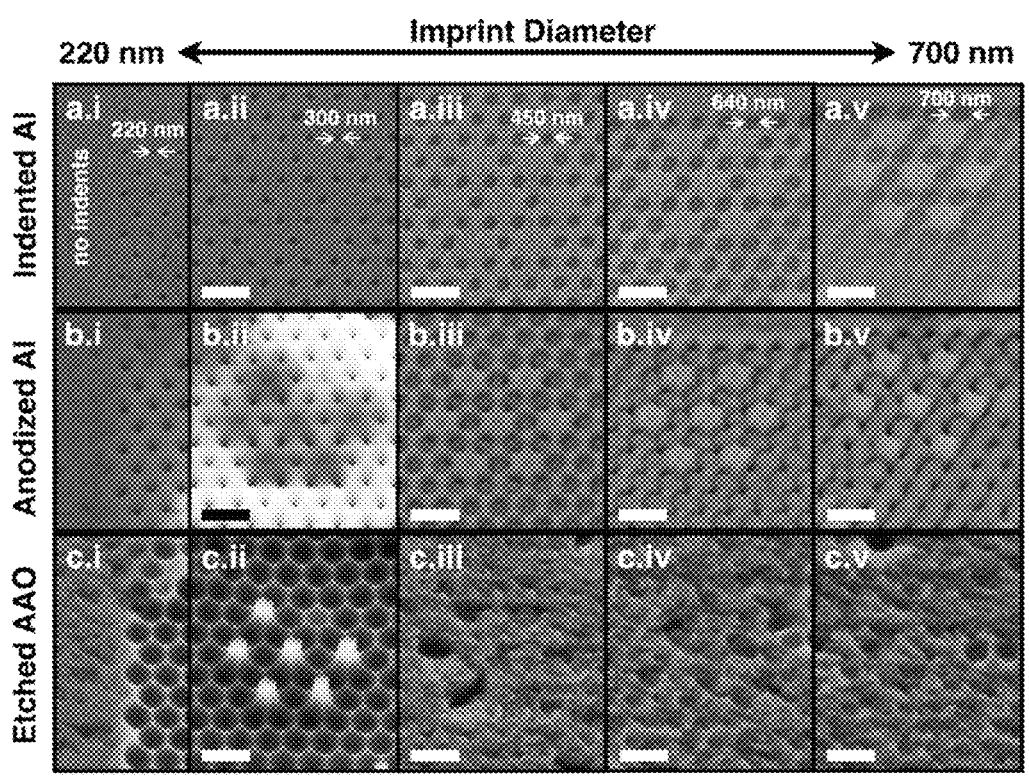
FIG. 15 shows SEM images showing the dependence of Al nanowire growth on imprint post diameter. Images show fabrication steps: (a) imprinted Al, (b) anodized Al, (c) Al surface after etching away anodized aluminum oxide. These images, along with the results in FIG. 3, show that: (i) pores did not nucleate in the area on the left with no indents, (ii) indents of diameter ≤400 nm produced pores at indent sites and Al nanowires at missing indent sites, (iii-v) indents of diameter ≥450 nm did not cause pores to nucleate. At areas where no pores nucleated, the anodized aluminum oxide was approximately conformal to the Al surface; after etching this oxide away a rough and planar Al surface was revealed.

Ni posts were used to imprint the Al surface with an array of indents. Ni was chosen because of its hardness and compatibility with an electron-beam lithography (EBL) technique for fabricating post arrays. The use of EBL allowed Ni posts to be left out of certain lattice sites in the array, such that after imprinting the Al there would be missing indents at certain lattice sites of the indent array. This prevented the Al from anodizing at the sites of the missing indents. As shown in FIG. 15, there is apparently a maximum indent diameter for which pores selectively nucleate at indented sites and not sites missing an indent. FIG. 16 shows photographs of the experimental setup used in the fabrication of Ni posts and Al nanowires.

Stamp preparation: To produce the stamp, glass slides 16 mm×15 mm were piranha cleaned and then coated with 50 nm of Ni with a Sharon electron beam deposition system. HMDS (VLSI grade 0.1 μm filtered from Ultra Pure Solutions, Inc.) was spun on (step 1: 5 sec, 500 rpm, 100 rpm/sec; step 2: 45 s, 4000 rpm, 550 rpm/s) to remove moisture from the sample surface, followed by electron beam resist (950 PMMA A4 from MicroChem) spun on (step 1: 5 s, 500 rpm, 100 rpm/s; step 2: 45 s, 4000 rpm, 550 rpm/s) to create a nominally 200 nm thick PMMA film. A 120 s delay between applying the PMMA and initiating the spin steps was included to allow bubbles in the PMMA to dissipate. The PMMA was then pre-expose baked at 180° C. for 25 min on a hotplate. Arrays of nominally 100 nm diameter holes were written into the PMMA with a JEOL SEM using a dosage of ~1300 μC/cm². The PMMA was then developed with 1:3 MicroChem MIBK:IPA (MIBK/IPA 1:3 Developer from MicroChem) for 40 s, IPA for 20 s, and finally DI water for 20 s. Ni was then electroplated into the holes using Ni plating solution (SN-10 Ni Plating Solution from Transene, Inc.), a counter electrode (47 mm² of exposed surface area of coil of Pt wire, 0.1 mm diameter, Premion 99.997% Pt from Alfa Aesar), and a potentiostat (Gamry Interface 1000 running a chronopotentiometry scan) to produce nominally 100 nm tall Ni posts. The PMMA was subsequently dissolved by placing the stamp in a bath of acetone for a few minutes.

Electropolish Al: High purity Al foil (annealed, Puratronic, 99.9995%, Alfa Aesar) of thickness 200 μm and surface roughness of 30 nm (measured by AFM), was cut into 5 mm×10 mm strips using scissors. The strips were flattened between two glass slides using a custom-made vice composed of two flat Al plates (one plate can move vertically by turning a 5 mm diameter screw, the other comprised the base of the vice). The Al foil was then rinsed with ethanol to remove moisture from the surface (moisture causes degradation of the Al surface during electropolishing—specifically the appearance of a rough off-white film) and immersed in a bath of 1 perchloric acid:3 ethanol (70% perchloric acid Reagent ACS Grade from GFS Chemicals, 90% ethanol (5.5% Isopropanol, 4.5% Methanol) HPLC Grade from Fisher), which was stirred at 120 rpm with a 10 mm magnetic Teflon coated stirring rod and held at 5° C. via a jacketed beaker and circulating bath (Polystat 1212202 from Cole Parmer). A 5 mm diameter 80 mm length carbon rod (Fisher Scientific, cat. no. S43501) was simultaneously immersed in the solution as a counter electrode. Electrical contact was made to the Al foil and C rod via flat-tipped alligator clips (Micro 1⅛" Smooth Clips from RadioShack). 10-20 V was applied with a high current voltage source (Kepco model: KS36-10M current regulated power supply) for 5-10 min (voltage and time were fine-tuned each day electropolishing took place). The polished Al had a mirror finish with surface roughness 3.9 nm as determined by AFM.

Imprint Al: The polished Al foil was placed polished-side-down on top of the Ni stamp (with Ni posts facing up) and a small piece (2 mm×2 mm) of Teflon plumbing tape was placed on top of the Al at the region to be imprinted. This stack was sandwiched between two glass slides, and the sandwich was placed into the custom vice. The vice was carefully closed to compress the Al against the Ni stamp and imprint the Al. The imprinted Al developed iridescence in the region imprinted by Ni posts, and had a surface roughness of 2.8 nm.

Anodize Al: A 2.5-3.5 mm diameter circular window was cut into adhesive Teflon tape (Tape with PTFE Film, Beige 5498, Silicon-free, 4 mil, part #5498-10 from All-Spec Industries), and the tape was used to mask the imprinted Al foil. The tape was arranged such that the window exposed the imprinted region of the Al. (Note: subsequent experiments demonstrated the tape to be unnecessary.) The Al foil was placed in a beaker of:

50 ml Ethylene Glycol (E178-4 Ethylene Glycol Certified from Fisher)
50 ml 2% wt Citric acid (anhydrous, reagent ACS, 99.5% from Acros)
2.9 ml 0.1% wt Phosphoric acid (85% solution in water from Acros Organics)

which was held at 10° C. via a jacketed beaker and circulating bath (Polystat 1212202 from Cole Parmer). For Al nanowires with a minimum pitch of 2.4 μm (i.e. an AAO template of pitch 1.2 μm), 480 V was applied with a DC voltage source (Fluke 412B) between the Al foil and a carbon counter electrode for a duration appropriate for the desired height of the Al nanowires.

Etch $Al_2O_3$: The anodized Al foil was rinsed with deionized water (DI) and placed for 50 minutes in a beaker containing 50 ml of 6% wt Phosphoric Acid (85% Phosphoric acid from Acros Organics) and 1.8% wt Chromic Acid (10% w/v Chromic Acid from Ricca Chemical Company) in DI held at 63° C.

Final Rinse: The Al foil was rinsed with DI and dried by flowing a nitrogen stream across it. This exposed the Al nanowires allowing them to be imaged via SEM. Iridescence was visible to the eye where there were Al nanowires.

In this specification and the appended claims, the singular forms "a," "an," and "the" include plural reference, unless the context clearly dictates otherwise.

Unless defined otherwise, all technical and scientific terms used herein have the same meaning as commonly understood by one of ordinary skill in the art. Although any methods and materials similar or equivalent to those described herein can also be used in the practice or testing of the present disclosure, the preferred methods and materials are now described. Methods recited herein may be carried out in any order that is logically possible, in addition to a particular order disclosed.

INCORPORATION BY REFERENCE

References and citations to other documents, such as patents, patent applications, patent publications, journals, books, papers, web contents, have been made in this disclosure. All such documents are hereby incorporated herein by reference in their entirety for all purposes. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

EQUIVALENTS

The representative examples are intended to help illustrate the invention, and are not intended to, nor should they be construed to, limit the scope of the invention. Indeed, various modifications of the invention and many further embodiments thereof, in addition to those shown and described herein, will become apparent to those skilled in the art from the full contents of this document, including the examples and the references to the scientific and patent literature included herein. The examples contain important additional information, exemplification and guidance that can be adapted to the practice of this invention in its various embodiments and equivalents thereof.

What is claimed is:

1. A method for producing ordered metal nanowire arrays, comprising:
   providing a metal substrate;
   imprinting the surface of the metal substrate to form a plurality of indents and missing indents at lithographically-defined locations according to a pre-selected pattern;
   anodizing the metal substrate to form a metal oxide template corresponding to the indents and missing indents; and
   etching the anodized metal oxide to form a plurality of vertically-oriented and laterally-ordered metal nanowires according to the pre-selected pattern.

2. The method of claim 1, further comprising rinsing the metal substrate.

3. The method of claim 2, wherein the metal is aluminum (Al).

4. The method of claim 3, wherein the metal substrate is a metal foil.

5. The method of claim 4, wherein imprinting the surface of the metal substrate is performed with a Ni stamp.

6. The method of claim 5, wherein anodizing the metal substrate forms a aluminim oxide ($Al_2O_3$) template.

7. The method of claim 6, wherein etching the anodized metal oxide results in a plurality of vertically-oriented, freestanding metal nanowires.

8. The method of claim 7, wherein the plurality of vertically-oriented metal nanowires are laterally-ordered with discrete and controlled positions.

9. The method of claim 8, wherein the plurality of vertically-oriented metal nanowires are characterised by a height being greater than about 10 μm and are positioned with pitches greater than about 2 μm.

10. The method of claim 9, wherein the metal nanowires are characterised by a hexagonal cross-section comprising sharp edges.

11. The method of claim 4, wherein imprinting the surface of the metal substrate is performed with a mask of $Al_2O_3$ or SU8 and a PDMS stamp and etching imprints through openings in the mask before or during anodization.

* * * * *

UNITED STATES PATENT AND TRADEMARK OFFICE
CERTIFICATE OF CORRECTION

PATENT NO. : 10,023,971 B2
APPLICATION NO. : 15/059200
DATED : July 17, 2018
INVENTOR(S) : Nathan T. Nesbitt and Michael J. Naughton Page 1 of 1

It is certified that error appears in the above-identified patent and that said Letters Patent is hereby corrected as shown below:

In the Specification

In Column 1 immediately following the title, insert the following section:
--Statement Regarding Federally Funded Research or Development
This invention was made with government support under grant number DGE1258923 awarded by the National Science Foundation. The Government has certain rights in the invention.--

Signed and Sealed this
Seventh Day of July, 2020

Andrei Iancu
*Director of the United States Patent and Trademark Office*